US010749018B2

(12) United States Patent
Jung

(10) Patent No.: US 10,749,018 B2
(45) Date of Patent: Aug. 18, 2020

(54) SWITCH ASSEMBLY OF REACTIVE POWER COMPENSATION APPARATUS

(71) Applicant: LSIS CO., LTD., Anyang-si, Gyeonggi-do (KR)

(72) Inventor: Teagsun Jung, Anyang-si (KR)

(73) Assignee: LSIS CO., LTD., Anyang-si, Gyeonggi-Do (KR)

(*) Notice: Subject to any disclaimer, the term of this patent is extended or adjusted under 35 U.S.C. 154(b) by 73 days.

(21) Appl. No.: 16/279,473

(22) Filed: Feb. 19, 2019

(65) Prior Publication Data

US 2019/0305120 A1 Oct. 3, 2019

(30) Foreign Application Priority Data

Mar. 30, 2018 (KR) .................. 10-2018-0037097

(51) Int. Cl.
*H01L 29/74* (2006.01)
*H02J 3/18* (2006.01)
(Continued)

(52) U.S. Cl.
CPC ...... *H01L 29/7408* (2013.01); *H01L 23/4012* (2013.01); *H01L 23/473* (2013.01);
(Continued)

(58) Field of Classification Search
CPC . H01L 23/4012; H01L 23/473; H01L 25/117; H01L 29/7408; H02B 1/04;
(Continued)

(56) References Cited

U.S. PATENT DOCUMENTS 3,864,607 A * 2/1975 Phillips .............. H05K 7/20509
361/692
4,578,745 A * 3/1986 Olsson .................. H01L 23/473
257/E23.098
(Continued)

FOREIGN PATENT DOCUMENTS

CN 102097809 A 6/2011
JP H08162609 A 6/1996
(Continued)

OTHER PUBLICATIONS

Korean Notice of Allowance for related Korean Application No. 10-2018-0037097; action dated Aug. 6, 2019; (2 pages).
(Continued)

*Primary Examiner* — Jacob R Crum
(74) *Attorney, Agent, or Firm* — K&L Gates LLP

(57) ABSTRACT

Each of the first and second switching modules may include first through (n+1)th cooling plates stacked along a vertical direction with respect to the support module; first through nth switches respectively disposed between the first through (n+1)th cooling plates; a first electrode plate disposed on the (n+1)th cooling plate; a first supporting member disposed on the first electrode plate; a first pressing member disposed between the first electrode plate and the first supporting member; a second electrode plate disposed below the first cooling plate; a second supporting member disposed below the second electrode plate; and a second pressing member disposed between the second electrode plate and the second supporting member.

12 Claims, 8 Drawing Sheets

(51) Int. Cl.
*H01L 23/473* (2006.01)
*H02M 7/00* (2006.01)
*H01L 23/40* (2006.01)
*H05K 7/20* (2006.01)
*H01L 25/11* (2006.01)

(52) U.S. Cl.
CPC .............. *H02J 3/18* (2013.01); *H02J 3/1807* (2013.01); *H02M 7/003* (2013.01); *H05K 7/20927* (2013.01); *H01L 25/117* (2013.01)

(58) Field of Classification Search
CPC . H02B 1/56; H02J 3/18; H02J 3/1807; H05K 7/20254; H05K 7/20272; H05K 7/20927; H02M 7/003
See application file for complete search history.

(56) References Cited

U.S. PATENT DOCUMENTS

| | | | | |
|---|---|---|---|---|
| 5,399,803 | A | * | 3/1995 | Johansson .............. H02M 7/106 174/45 R |
| 2002/0017717 | A1 | * | 2/2002 | Gruning ................ H02M 7/003 257/718 |
| 2004/0089934 | A1 | * | 5/2004 | Shimoida .............. H01L 25/071 257/686 |
| 2018/0366390 | A1 | * | 12/2018 | Mizushiri ............... H01L 23/40 |

FOREIGN PATENT DOCUMENTS

| | | |
|---|---|---|
| JP | 2011211771 A | 10/2011 |
| JP | 2016208711 A | 12/2016 |
| JP | 2017022863 A | 1/2017 |
| KR | 20100121522 A | 11/2010 |
| KR | 20140115185 A | 9/2014 |
| WO | 2012088676 A1 | 7/2012 |
| WO | 2016170910 A1 | 10/2016 |

OTHER PUBLICATIONS

Korean Office Action for related Korean Application No. 10-2018-0037097; action dated May 23, 2019; (5 pages).
European Search Report for related European Application No. 19158133.9; action dated May 14, 2019; (7 pages).

* cited by examiner

SWITCH ASSEMBLY OF REACTIVE POWER COMPENSATION APPARATUS

CROSS-REFERENCE TO RELATED APPLICATIONS

Pursuant to 35 U.S.C. § 119(a), this application claims the benefit of earlier filing date and right of priority to Korean Application No. 10-2018-0037097, filed on Mar. 30, 2018, which is herein expressly incorporated by reference in its entirety.

BACKGROUND OF THE INVENTION

1. Field of the Invention

The present disclosure relates to a switch assembly of a reactive power compensation apparatus.

2. Description of the Conventional Art

Due to the development of industry and the increase of the population, power demand is soaring, but power production is limited.

Accordingly, a power system for supplying power generated at a production site to a demand site stably without loss has become increasingly important.

There is a need for FACTS (Flexible AC Transmission System) facilities for power flow, system voltage, and stability improvement. The FACTS facilities include reactive power compensation apparatuses such as a SVC (Static Var Compensator) or a STATCOM (STATic synchronous COMpensator). These reactive power compensation apparatuses are connected in parallel to a power system to compensate for reactive power required in the power system.

The SVC may be configured by combining a Thyristor Controlled Reactor (TCR) that controls the phase of a reactor using a thyristor according to its application, a Thyristor Switched Capacitor (TSC) that switches a capacitor, a Fixed Capacitor Bank, and the like.

The SVC may include a thyristor valve connected to a transformer to control the voltage of the power system and a gate unit that controls the gate of the thyristor valve.

When a plurality of thyristors are connected in series to each other in the thyristor valve and conducted under the control of the gate unit, a high voltage or a high current flows through the thyristor. In addition, each thyristor is heavy and bulky, so it is not easy to handle.

Therefore, in order to construct a thyristor valve in an SVC as an assembly, many considerations such as the arrangement of the thyristor, the insulation of the thyristor, the heat dissipation of the thyristor, the weight of the thyristor, and the volume of the thyristor must be taken into account.

However, an optimal SVC-related switch assembly has not yet been developed to satisfy all of these requirements.

SUMMARY OF THE INVENTION

The present disclosure is provided to solve the foregoing problems and other problems.

Another object of the present disclosure is to provide a switch assembly of a reactive power compensation apparatus of a new structure.

Still another object of the present disclosure is to provide a switch assembly of a reactive power compensation apparatus having an optimal arrangement structure satisfying various requirements.

In order to achieve the foregoing and other objects, according to an aspect of the present disclosure, there is provided a switch assembly of a reactive power compensation apparatus, and the switch assembly may include a support module; a first switching module having a first stack structure perpendicular to the supporting module; and a second switching module having a second stack structure perpendicular to the supporting module, the second switching module being connected in parallel with the first switching module, wherein each of the first and second switching modules includes first through (n+1)th cooling plates stacked along a vertical direction with respect to the support module; first through nth switches respectively disposed between the first through (n+1)th cooling plates; a first electrode plate disposed on the (n+1)th cooling plate; a first supporting member disposed on the first electrode plate; a first pressing member disposed between the first electrode plate and the first supporting member; a second electrode plate disposed below the first cooling plate; a second supporting member disposed below the second electrode plate; and a second pressing member disposed between the second electrode plate and the second supporting member, and the second pressing member includes a first pressing support portion disposed between the second electrode plate and the second supporting member; and an insertion guide portion configured to guide the insertion of a pressing device that presses the first pressing support portion.

Here, the switch assembly may further include a second pressing support portion disposed between the first pressing support portion and the insertion guide portion.

Furthermore, the insertion guide portion may include a horizontal portion disposed on the second supporting member; and a vertical portion extended from the horizontal portion through the second supporting member.

Furthermore, the horizontal portion and the second pressing support portion may be in surface contact with each other.

Furthermore, the vertical portion may include an insertion hole for inserting the pressing device.

Furthermore, the first pressing support portion may include an insertion groove corresponding to a protruding portion of the pressing device.

Furthermore, the second pressing support portion may include an opening one side of which is open.

Furthermore, the second pressing support portion may include a plurality of support plates.

Furthermore, the first pressing member may include a pressing portion disposed between the first supporting member and the first electrode plate; and an elastic portion disposed between the first supporting member and the pressing portion.

Furthermore, the pressing portion may include a first region in surface contact with the (n+1)th cooling plate, a second region smaller than an area of the first region and extended in an upward direction from the first region, and a third region extended above the first supporting member from the second region through the first supporting member.

Furthermore, the elastic portion may surround the second region of the pressing portion.

In addition, the elastic portion may surround the first region located below the first supporting member.

The effects of the switch assembly of the reactive power compensation apparatus according to each embodiment of the present disclosure will be described as follows.

According to at least one of embodiments, a thyristor and a switch may be stacked in a vertical direction, thereby having an advantage capable of optimizing arrangement structure and minimizing the occupied area.

According to at least one of embodiments, a cooling plate through which cooling water flows on the upper and lower surfaces of the switch may be provided, thereby having an advantage of facilitating heat dissipation of the switch.

According to at least one of embodiments, the switch, the cooling plate, and the like may be modularized, thereby having an advantage of facilitating installation.

According to at least one of embodiments, a structure in which a pressing device can be inserted to a lower side of the switching module may be provided, thereby an advantage capable of easily raising the switch and the cooling plate in an upward direction using the pressing device.

Further scope of applicability of the embodiments will become apparent from the detailed description given hereinafter. However, it should be understood that the detailed description and specific embodiments such as preferred embodiments are given by way of illustration only, since various changes and modifications within the spirit and scope of the embodiments will become apparent to those skilled in the art from this detailed description.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
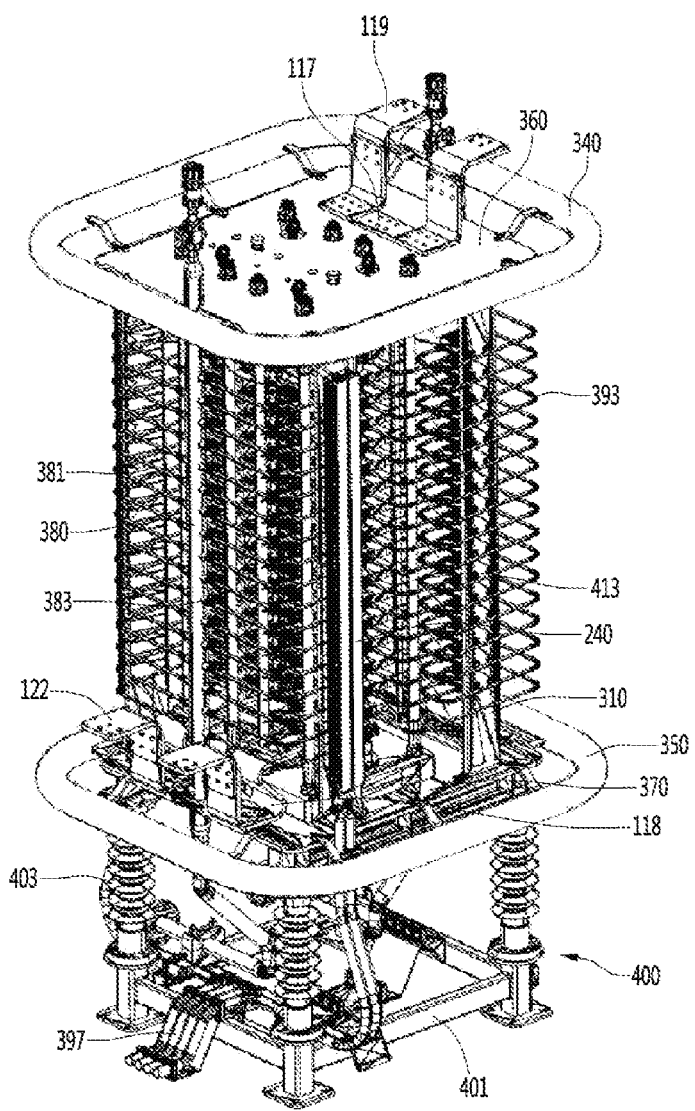
FIG. 1 is a perspective view illustrating a switch assembly of a reactive power compensation apparatus according to an embodiment.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the embodiments disclosed herein, moreover, the detailed description will be omitted when specific description for publicly known technologies to which the invention pertains is judged to obscure the gist of the present disclosure. Furthermore, it should be understood that the accompanying drawings are merely illustrated to easily understand an embodiment disclosed herein, and therefore, the technological concept disclosed herein is not limited by the accompanying drawings, and the concept of the present disclosure should be understood to include all modifications, equivalents, and substitutes included in the concept and technological scope of the embodiment.

Figure 2:
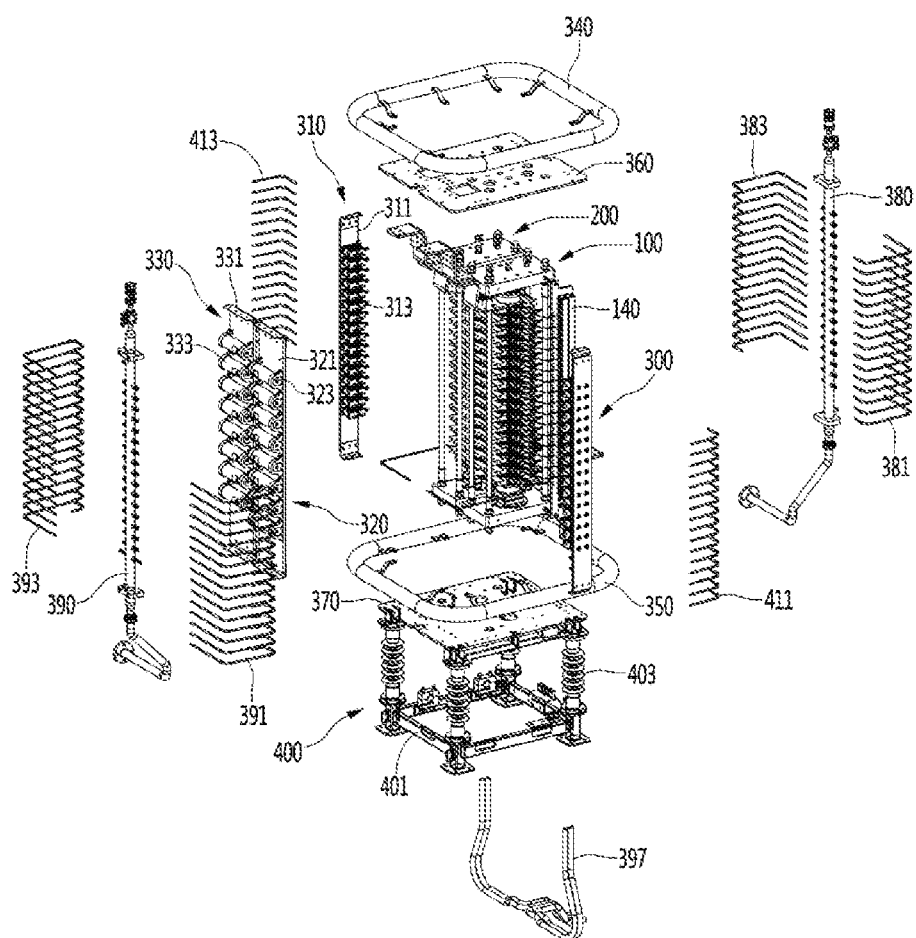
FIG. 2 is an exploded perspective view illustrating a switch assembly of a reactive power compensation apparatus according to an embodiment.
Figure 3:
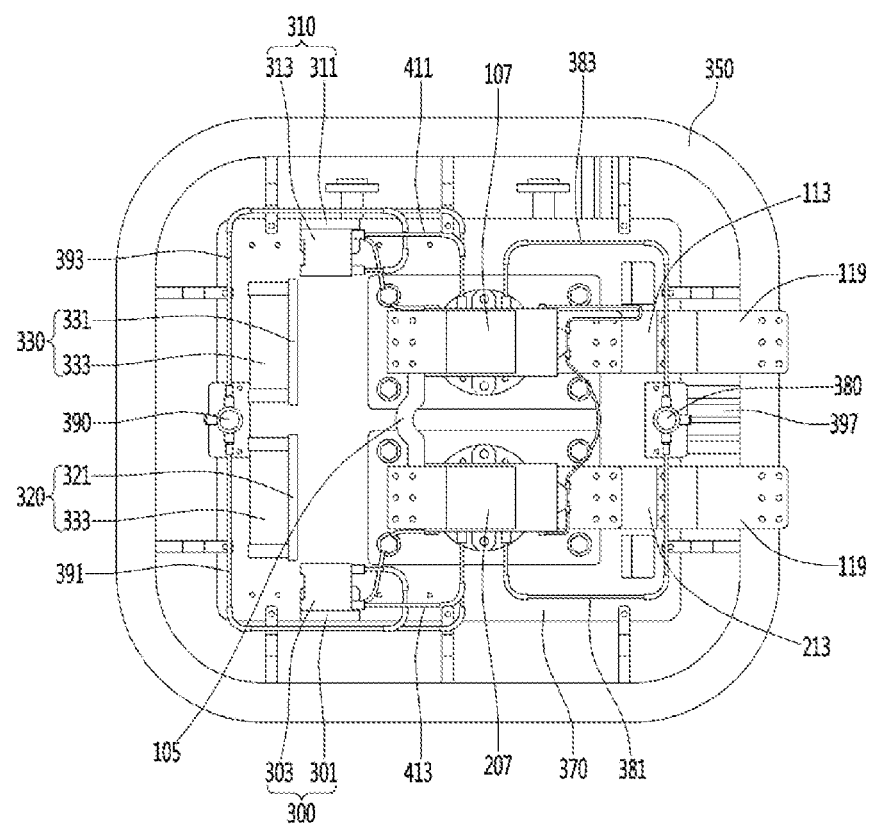
FIG. 3 is a plan view illustrating a switch assembly of a reactive power compensation apparatus according to an embodiment.

FIG. 1 is a perspective view illustrating a switch assembly of a reactive power compensation apparatus according to an embodiment, and FIG. 2 is an exploded perspective view illustrating a switch assembly of a reactive power compensation apparatus according to an embodiment, and FIG. 3 is a plan view illustrating a switch assembly of a reactive power compensation apparatus according to an embodiment. The reactive power compensating apparatus illustrated in FIGS. 1 through 3 illustrate a stationary reactive power compensating apparatus, for instance, but the embodiment is not limited thereto.

FIGS. 1 through 3 illustrate a single switch assembly, but a plurality of switch assemblies electrically connected to each other are also possible.

<Support Module>

A switch assembly of a reactive power compensation apparatus according to an embodiment may provide a support module 400.

The support module 400 may support all components constituting the reactive power compensation apparatus. The support module 400 may allow the components disposed thereon to be insulated from the earth.

The support module 400 may include a frame 401 including four columns and four connecting portions that connect these columns. The frame 401 may be made of a material having excellent insulation and excellent supporting strength. For instance, the frame 401 may be made of stainless steel or a steel beam.

For instance, the column may be provided with an insulating member 403 or the column itself may be the insulating member 403. The insulating member 403 may be an insulator. The insulator is an insulating body used for insulating and supporting an electric conductor, and hard porcelain may be used for the insulating body, for instance.

Though will be described later, the support module 400 may be provided with a fastening portion for fastening an optical cable 397 or a fastening portion for fastening first and second main pipes 380, 390. The optical cable 397 supplies a drive signal, for example, a gate signal, to a first switching module 100 or a second switching module 200, or supplies various signals measured from the first switching module 100 or the second switching module 200, for instance, a voltage signal, a current signal, a temperature signal, and the like, to a controller (not shown). The first and second main pipes 380, 390 supply cooling water to the first switching module 100 or the second switching module 200 to cool the first switching module 100 or the second switching module 200.

<First Switching Module 100>

Figure 4:
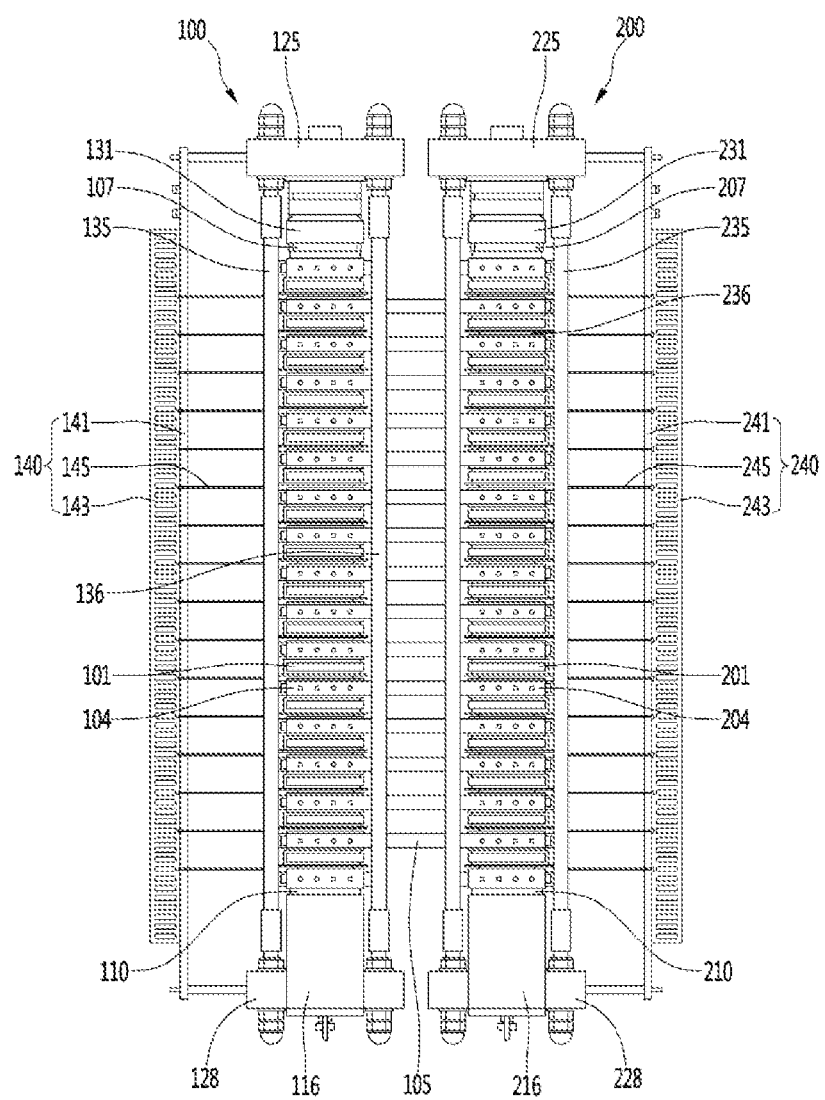
FIG. 4 is a front view illustrating a switching module according to an embodiment.

A switch assembly of a reactive power compensation apparatus according to an embodiment may include the first switching module 100. The first switching module 100 may have a first stack structure that is perpendicular to the support module 400. The first switching module 100 will be described in detail with reference to FIGS. 4 and 5. FIG. 4 is a front view illustrating a switching module according to an embodiment, and FIG. 5 is a perspective view illustrating a switching module according to an embodiment.

Figure 5:
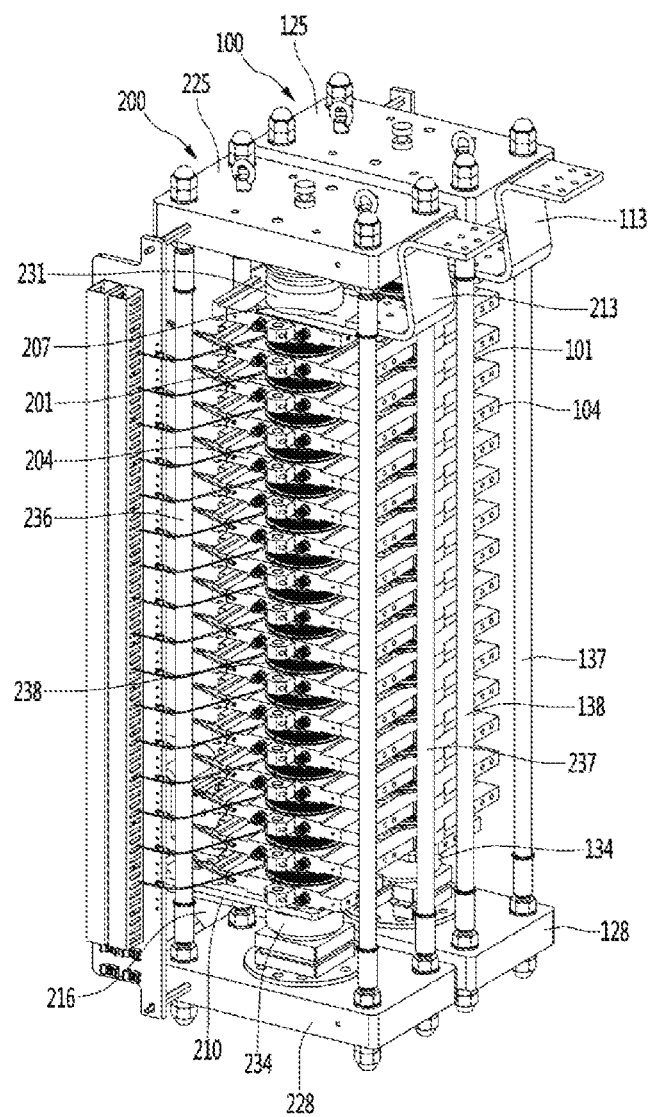
FIG. 5 is a perspective view illustrating a switching module according to an embodiment.

Referring to FIGS. 4 and 5, the first switching module 100 may be disposed on the support module 400. A second support plate 370 which will be described later is fastened to an upper surface of the support module 400, and both the first switching module 100 and the second switching module 200 may be fastened to the second support plate 370. A second support plate 370 may be disposed under the first switching module 100 and the second switching module 200. Moreover, a second support plate 360 may be disposed under the first switching module 100 and the second switching module 200. In this case, an upper side of each of the first and second switching modules 100, 200 may be fastened to the first support plate 360. Accordingly, the first and second switching modules 100, 200 may be disposed between the first support plate 360 and the second support plate 370.

The first switching module 100 may include a plurality of switches 101 stacked along a vertical direction with respect to the support module 400. The first switching module 100 may be a forward switching module in which a current flows from the second electrode plate 110 to the first electrode plate 107 in an upward direction, for instance, but the present disclosure is not limited thereto.

The plurality of switches 101 may be connected in series to each other. A first switch is provided, a second switch is disposed on the first switch, and a second switch is disposed on the second switch. In this manner, the plurality of switches 101 may be arranged on the support module 400.

The switch 101 may be formed in a circular shape when viewed from above, but the present disclosure is not limited thereto. The switch 101 includes a body, and a semiconductor device may be embedded in the body. The body may be made of insulating material. Each of the lower surface and the upper surface of the body may have a planar shape.

The switch 101 may be a semiconductor device, for instance, a thyristor. The switch 101 may include a gate, an anode, and a cathode. For instance, it is assumed that a first switch, a second switch, and a third switch are sequentially arranged on the support module 400. In this case, the cathode of the second switch may be electrically connected to the anode of the first switch, and the anode of the second switch may be electrically connected to the cathode of the third switch.

The first switching module 100 may include a plurality of cooling plates 104 stacked along a vertical direction with respect to the support module 400. The switch 101 may be disposed between the cooling plates 104. The switch 101 and the cooling plate 104 may be alternately stacked. For instance, the cooling plate 104 is provided, the switch 101 is disposed on the cooling plate 104, and the cooling plate 104 is disposed on the switch 101. The cooling plate 104 may be provided on the uppermost switch among the plurality of switches 101 and the cooling plate 104 may be provided below the undermost switch among the plurality of switches 101. In other words, when n switches 101 are provided therein, (n+1) cooling plates may be provided therein. In this case, the first switch is located on the first cooling plate, and the nth switch is located under the (n+1)th cooling plate.

The cooling plate 104 may have a rectangular shape, for instance, when viewed from above, but the present disclosure is not limited thereto. The size of the cooling plate 104 may be larger than that of the switch 101 at least. The switch 101 may be located at the center of the cooling plate 104, but the present disclosure is not limited thereto.

The cooling plate 104 and the switch 101 may be in surface contact. For instance, an upper surface of the first cooling plate may be in surface contact with a lower surface of the first switch. A lower surface of the second cooling plate is in surface contact with an upper surface of the first switch, and an upper surface of the second cooling plate is in surface contact with a lower surface of the second switch. A lower surface of the third cooling plate may be in surface contact with an upper surface of the second switch.

As described above, the lower surface and the upper surface of the switch 101 are brought into surface contact with the cooling plate 104 disposed below and above the switch 101 to cool the switch 101 by the cooling plate 104, thereby easily releasing heat generated from the switch 101. The remaining switches other than the first switch, the second switch, and the third switch of the plurality of switches 101 and the remaining cooling plates other than the first cooling plate, the second cooling plates, and the third cooling plate of the plurality of cooling plates 104 may also have the foregoing arrangement structure.

The first switching module 100 may include first and second electrode plates 107, 110 that are electrically connected to a plurality of vertically disposed switches 101.

For instance, the first electrode plate 107 may be disposed on a switch located at the top among the plurality of vertically disposed switches 101. For instance, the second electrode plate 110 may be disposed on a switch located at the bottom among the plurality of vertically disposed switches 101.

As described above, the cooling plate 104 may be disposed above and below the switch 101 for cooling the switch 101. Therefore, since the cooling plate 104 is located between the first electrode plate 107 and the switch 101, the first electrode plate 107 may be electrically connected to the switch 101 through a connecting member (not shown), but the present disclosure is not limited thereto. Similarly, since the cooling plate 104 is located between the second electrode plate 110 and the switch 101, the second electrode plate 110 may be electrically connected to the switch 101 through a connecting member (not shown).

The first and second electrode plates 110 may be copper plates made of copper (Cu), but the present disclosure is not limited thereto.

The first electrode plate 107 may be in surface contact with the cooling plate 104 disposed at the top and the second electrode plate 110 may be in surface contact with the cooling plate 104 disposed at the bottom.

The first switching module 100 may include first and second terminals 113, 116 connected to the first and second electrode plates 110, respectively.

The first and second terminals 113, 116 may be made of a metal having excellent electrical conductivity. For instance, the first and second terminals 113, 116 may include copper (Cu) or aluminum (Al).

The first terminal 113 may be electrically connected to the first electrode plate 107. The first terminal 113 may be bent at least once from the first electrode plate 107 and protruded along a lateral direction. For instance, the first terminal 113 may include a first region protruded from the first electrode plate 107 in a lateral direction, a second region extended subsequent to being bent in an upward direction from an end of the first region, and a third region extended from an end of the second region along a lateral direction. The second terminal 116 may be electrically connected to the second electrode plate 110. The second terminal 116 may be bent at least once from the second electrode plate 110 and protruded along a lateral direction. For instance, the first terminal 113 and the second terminal 116 may be protruded in the same direction, but the present disclosure is not limited thereto.

The first and second terminals 113, 116 may be protruded along lateral directions opposite to each other. For instance, the first terminal 113 may be protruded along a first lateral direction, for instance, and the second terminal 116 may be protruded along a second lateral direction, for instance, opposite to the first lateral direction.

The first switching module 100 may include first and second supporting members 125, 128 provided to support a plurality of switches 101 and a plurality of cooling plates 104.

The first and second supporting members 125, 128 may have a plate shape. The first and second supporting members 125, 128 may have a rectangular shape when viewed from above.

The first and second supporting members 125, 128 may be made of a material having excellent insulating properties and supporting strength. For instance, the first and second supporting members 125, 128 may be made of stainless steel.

For instance, the first supporting member 125 may be disposed above the top cooling plate among the plurality of cooling plates 104. For instance, the second supporting member 128 may be disposed under the bottom cooling plate among the plurality of cooling plates 104.

Here, the first supporting member 125 may be disposed above the first electrode plate 107. Furthermore, the second supporting member 128 may be disposed below the second electrode plate 110.

A size of each of the first and second supporting members 125, 128 may be larger than that of the cooling plate 104. The size of each of the first and second supporting members 125, 128 is large, and thus the support rods 135, 136, 137, 138, which will be described later, may be spaced apart from the cooling plate 104 and disposed on a side surface of the switch 101 and the cooling plate 104. In other words, the fastening of the support rods 135, 136, 137, 138 may be facilitated because the support rods 135, 136, 137, 138 are not disturbed by the cooling plate 104.

The first switching module 100 may include a plurality of support rods 135, 136, 137, 138 disposed between the first supporting member 125 and the second supporting member 128. Although four support rods 135, 136, 137, 138 are illustrated in the drawing, four or fewer or four or more support rods may be provided.

The support rods 135, 136, 137, 138 have a circular shape when viewed from above, but the present disclosure is not limited thereto. The support rods 135, 136, 137, 138 are disposed between the first supporting member 125 and the second supporting member 128 so that one side is fastened to the first supporting member 125 and the other side is connected to the second supporting member 128. The first and second supporting members may be supported by the support rods 135, 136, 137, 138.

The support rods 135, 136, 137, 138 may be made of a material having excellent insulating properties and supporting strength. For instance, the support rods 135, 136, 137, 138 may be made of stainless steel.

The first switching module 100 may include first and second pressing members 131, 134 for pressing a plurality of switches 101 and a plurality of cooling plates 104 in a vertical direction.

The first and second pressing members 131, 134 may have elasticity. For instance, a first pressing member 131 may be pressed in a downward direction by the first supporting member 125. A plurality of switches 101 and a plurality of cooling plates 104 disposed below the first pressing member 131 may also be pressed in a downward direction as the first pressing member 131 is pressed in a downward direction. For instance, a second pressing member 134 may be pressed in an upward direction by the second supporting member 128. A plurality of switches 101 and a plurality of cooling plates 104 disposed above the second pressing member 134 may also be pressed along an upward direction as the second pressing member 134 is pressed in an upward direction.

Figure 6:
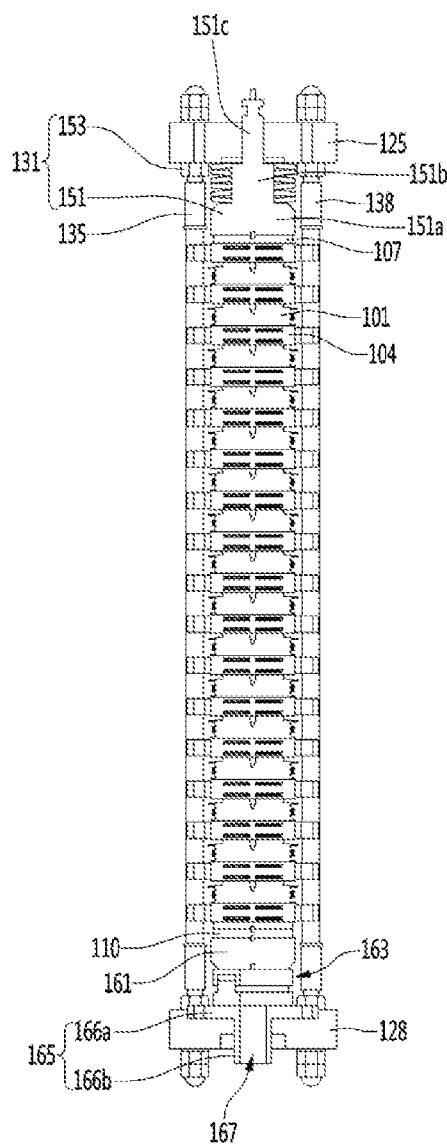
FIG. 6 is a cross-sectional view illustrating a first switching module according to an embodiment.
Figure 7:
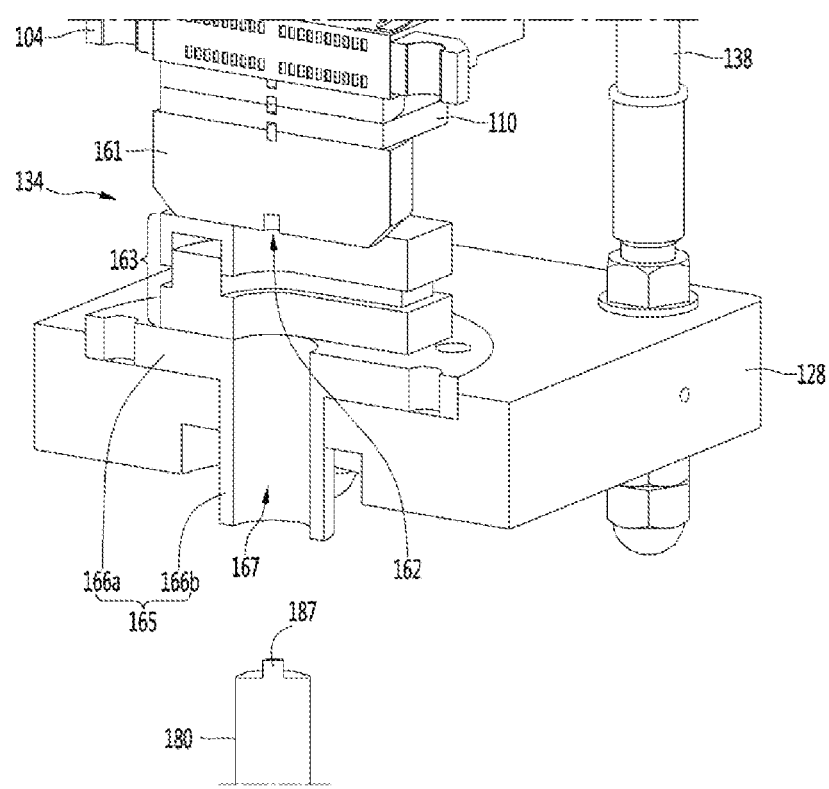
FIG. 7 is an enlarged view illustrating a lower portion of a first switching module according to an embodiment.

FIG. 6 is a cross-sectional view illustrating a first switching module according to an embodiment, and FIG. 7 is an enlarged view illustrating a lower portion of a first switching module according to an embodiment.

Referring to FIG. 6, the first pressing member 131 may be disposed between the first supporting member 125 and the first electrode plate 107. The first pressing member 131 may include a pressing portion 151 and an elastic portion 153. The pressing portion 151 and the elastic portion 153 may be disposed between the first supporting member 125 and the first electrode plate 107.

The pressing portion 151 may be disposed between the elastic portion 153 and the first electrode plate 107. The elastic portion 153 may be disposed between the first supporting member 125 and the pressing portion 151.

The pressing portion 151 includes a first region 151a in surface contact with a cooling plate located at the top of a plurality of cooling plates 104, a second region 151b extended in an upward direction from the first region 151a, and a third region 151c extended above the first supporting member 125 from the second region 151b through the first supporting member 125.

The elastic portion 153 may surround the second region 151b of the pressing portion 151 and surround the first region 151a located under the first supporting member 125. The elastic portion 153 may be made of an elastic material. The pressing portion 151 may be moved in an upward direction by pressure generated from a lower side of the first switching module 100. The pressing portion 151 moved in an upward direction may be restored when pressure generated from a lower side of the first switching module 100 is released.

As illustrated in FIG. 7, the second pressing member 134 may be disposed between the second electrode plate 110 and the second supporting member 128.

The second pressing member 134 may include a first pressing support portion 161 and a second pressing support portion 163. An insertion guide portion 165 may not be included in the second pressing member 134 but may exist as a separate component.

The first pressing support portion 161 may be disposed between the second electrode plate 110 and the second supporting member 125.

The insertion guide portion 165 may guide the insertion of the pressing device 180 to press the first pressing support portion 163 by the pressing device 180.

The pressure device is, for instance, a hydraulic cylinder, and may include a pressure supply part for supplying a pressure generated by the pump, that is, a hydraulic pressure, and a pressure transmission part for transmitting the generated hydraulic pressure. In this case, a pressure transmitting portion is inserted into the insertion guide portion 165 to press the first pressing support portion 161 by the pressure transmitting portion so as to raise a component located above the first pressuring support portion 161, for instance, the second electrode plate 110, the plurality of switches 101, the plurality of cooling plates 104, the first electrode plate 107, the first pressing member 131, and the like, in an upward direction.

The insertion guide portion 165 may include a horizontal portion 166a disposed on the second supporting member 128 and a vertical portion 166b extended through the second supporting member 128 from the horizontal portion 166*a*. The horizontal portion 166*a* may be in surface contact with the second pressing support portion 163. The vertical portion 166*b* may include an insertion hole 167 into which the pressing device 180 is inserted. The pressure transmission portion of the pressuring device may be inserted through an insertion hole of the insertion guide portion 165 to transmit the pressure of the pressure transmission portion to the first pressing support portion 161.

The first pressing support portion 161 may include an insertion groove 162 corresponding to a protruding portion 187 of the pressing device 180. The insertion groove 162 may be provided on a lower surface of the first pressing support portion 161. The insertion groove 162 may be formed inwardly from the lower surface of the first pressing support portion 161. The shape of the insertion groove 162 of the first pressing support portion 161 may correspond to that of the protruding portion of the pressing device. For instance, when the protruding portion 187 of the pressing device 180 is formed in a cylindrical shape, the insertion groove 162 of the first pressing support portion 161 may also have a cylindrical shape. The insertion groove 162 of the first pressing support portion 161 allows the pressing device to be stably fixed, and allows the first pressing support portion 161 to be stably pressed by the pressing device.

Although one insertion groove 162 is provided at the center of the first pressing support portion 161, at least two insertion grooves 162 spaced at the same distance radially from the center of the first pressing support portion 161, for instance, may also be provided.

Figure 8:
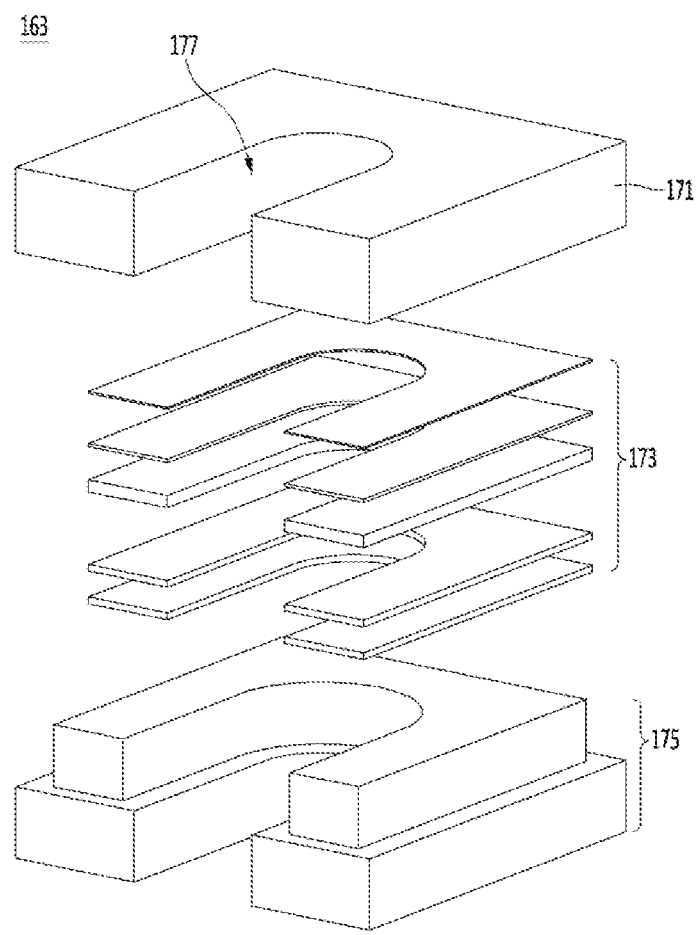
FIG. 8 illustrates a second pressing support portion of a first switching module according to an embodiment.

The second pressing support portion 163 may include a plurality of support plates 171, 173, 175 as illustrated in FIG. 8. The first support plate 171 may include at least one support plate. The second support plate 173 may include at least one support plate. The third support plate 175 may include at least one support plate.

The second support plate 173 may be made of an elastic material. The first support plate 171 may be disposed above the second support plate 173. The third support plate 175 may be disposed below the second support plate 173.

A thickness of the first support plate 171 may be greater than that of the second support plate 173. A thickness of the second support plate 173 may be greater than that of the first support plate 171 or the third support plate 175.

The first pressing support portion 161 may be pressed by the pressing device to allow the first pressing support portion 161 and the second supporting member 128 to be space apart from each other. In this case, the second pressing support portion 161 may be fitted or inserted in a lateral direction between the first pressing support portion 161 and the second pressing support portion 163. To this end, the second pressing support portion 163 may include an opening 177 at one side thereof.

A number of the first through third support plates 171, 173 175 or a number of each of the first through third support plates 171, 173, 175 may vary according to a size of distance between the first pressing support portion 161 and the second supporting members 128.

The first switching module 100 may include a plurality of thyristors and a signal generation unit 140 disposed on a side surface of the plurality of cooling plates 104.

The signal generation unit 140 may include a substrate 141 and a plurality of drive units 143 mounted on the substrate 141. The signal generation unit 140 may further include a signal line 145 electrically connecting the drive unit 143 and each switch 101. The drive unit 143 may generate a gate signal for switching each switch 101 to provide it to the each switch 101 through each signal line 145. Each switch 101 may be switched by the gate signal.

One side of the substrate 141 may be fastened to the first supporting member 125 and the other side thereof may be fastened to the second supporting member 128.

<Second Switching Module 200>

A switch assembly of a reactive power compensation apparatus according to an embodiment may include the second switching module 200. The second switching module 200 may be a reverse switching module in which a current flows from the first electrode plate 107 to the second electrode plate 110 in a downward direction, for instance, but the present disclosure is not limited thereto.

The detailed structure of a lower side of the first switching module 100 has been described in detail with reference to FIGS. 6 through 8 as described above. Since the structure of the second switching module 200 is also the same as that of the first switching module 100, it may be easily understood from FIGS. 6 through 8 and the description related thereto.

The second switching module 200 may be disposed on the same plane as the first switching module 100. In other words, the second switching module 200 may be mounted on an upper surface of the support module 400. For instance, the first switching module 100 may be disposed on a first region of the support module 400, and the second switching module 200 may be disposed on a second region of the support module 400.

The second switching module 200 may include a plurality of switches 201, a plurality of cooling plates 204, first and second electrode plates 207, 210, first and second terminals 213, 216, first and second supporting members 225, 228, a plurality of support rods 235, 236, 237, 238, first and second pressing members 231, 234 and a signal generation unit 240.

The switch 201 of the second switching module 200 may have the same structure as that of the switch 201 of the first switching module 100. The cooling plate 204 of the second switching module 200 may have the same structure as the cooling plate 104 of the first switching module 100. The first and second electrode plates 207, 210 of the second switching module 200 may have the same structure as the first and second electrode plates 107, 110 of the first switching module 100. The first and second electrode plates 213, 216 of the second switching module 200 may have the same structure as the first and second terminals 113, 116 of the first switching module 100. The first and second supporting members 225, 228 of the second switching module 200 may have the same structure as the first and second supporting members 125, 128 of the first switching module 100. The support rod of the second switching module 200 may have the same structure as that of the first switching module 100. The first and second electrode plates 231, 234 of the second switching module 200 may have the same structure as the first and second pressing members 131, 134 of the first switching module 100. The signal generation unit 240 of the second switching module 200 may have the same structure as the signal generation unit 140 of the first switching module 100. Accordingly, each component of the second switching module 200 may be easily understood from the respective components of the first switching module 100 described in detail above, and thus each component of the second switching module 200 will be briefly described.

A plurality of cooling plates 204 are provided, and a switch 201 may be disposed between the cooling plates 204. In other words, the second switching module 200 may have a second stack structure in which a plurality of cooling plates 204 and a plurality of switches 201 are stacked along a vertical direction with respect to the support module 400.

The cooling plate 204 and the switch 201 may be in surface contact. As described above, the lower surface and the upper surface of the switch 201 are brought into surface contact with the cooling plate 204 disposed below and above the switch 201 to cool the switch 201 by the cooling plate 204, thereby easily releasing heat generated from the switch 201.

The first electrode plate 207 may be disposed above a switch located at the top of a plurality of vertically disposed switches 201. For instance, the second electrode plate 210 may be disposed below a switch located at the bottom of the plurality of vertically disposed switches 201.

The cooling plate 204 may be located between the first electrode plate 207 and the switch 201.

The first terminal 213 may be electrically connected to the first electrode plate 207, and bent at least once from the first electrode plate 207 and protruded along a lateral direction. The second terminal 216 may be electrically connected to the second electrode plate 210, and bent at least once from the second electrode plate 210 and protruded along a lateral direction. The first and second terminals 213, 216 may be protruded along lateral directions opposite to each other.

The first supporting member 225 is disposed above the top of the plurality of cooling plates 204, and the second supporting member 228 is disposed below the bottom of the plurality of cooling plates 204. Accordingly, a plurality of switches 201 and a plurality of cooling plates 201 disposed between the first supporting member 225 and the second supporting member 228 may be supported by the first supporting member 225 and the second supporting member 228.

A plurality of support rods may be fastened to the first supporting member 225 and the second supporting member 228 to support the first and second supporting members.

The plurality of switches 201 and the plurality of cooling plates 204 disposed between the first and second pressing members 231, 234 may be pressed by the first and second pressing members 231, 234.

The signal generation unit 240 may include a substrate 241 and a plurality of drive units 243 mounted on the substrate 241. The signal generation unit 240 may further include a signal line 245 electrically connecting the drive unit 243 and each switch 201. The signal generation unit 240, as a member for generating a gate signal for switching each switch 201, may be disposed on a side surface of the plurality of switches 201 and the plurality of cooling plates 204 and fastened to the first supporting member 225 and the second supporting member 228.

<Connection Cooling Plate 105>

A switch assembly of a reactive power compensation apparatus according to an embodiment may include a connection cooling plate 105 for connecting a cooling unit of the first switching module 100 and a cooling unit of the second switching module 200.

The connection cooling plate 105 may be made of the same material as that of the cooling unit of the first switching module 100 and the cooling unit of the second switching module 200, but the present disclosure is not limited thereto.

The connection cooling plate 105 is detachable from the cooling unit of the first switching module 100 and the cooling unit of the second switching module 200. In other words, the connection cooling plate 105 may be fastened or unfastened to the cooling unit of the first switching module 100 and the cooling unit of the second switching module 200.

<Connection Electrodes 117, 118>

The switch assembly of the reactive power compensation apparatus according to an embodiment may include first and second connecting electrodes 117, 118.

The first connecting electrode 117 may fasten a first terminal 113 of the first switching module 100 and a first terminal 213 of the second switching module 200. Accordingly, the first terminal 113 of the first switching module 100 and the first terminal 213 of the second switching module 200 may be electrically connected to the first connecting electrode 117.

The second connecting electrode 118 may fasten a second terminal 116 of the first switching module 100 and a second terminal 216 of the second switching module 200. Accordingly, the second terminal 116 of the first switching module 100 and the second terminal 216 of the second switching module 200 may be electrically connected to the second connecting electrode 118.

<First and Second Bus Bars 119, 122>

The switch assembly of the reactive power compensation apparatus according to an embodiment may include first and second connecting electrodes 119, 122.

The first bus bar 119 may be fastened to the first connecting electrode 117. At least one or more first bus bars may be fastened to the first connecting electrode 117. The first bus bar 119 may be bent at least once from the first connecting electrode 117 and protruded in a lateral direction. The second bus bar 122 may be fastened to the second connecting electrode 118. At least one or more second bus bars may be fastened to the second connecting electrode 118. The second bus bar 122 may be bent at least once from the second connecting plate 118 and protruded along a lateral direction.

The first and second bus bars 119, 122 may be protruded along lateral directions opposite to each other.

In the embodiment, the first electrode plates 107, 207, the second electrode plates 110, 210, the first terminals 113, 213, the second terminals 116, 216, the first connecting electrode 117, the second connecting electrode 118, the first bus bar 119, and the second bus bar 122 may be made of a metal material having excellent electrical conductivity. The first electrode plates 107, 207, the second electrode plates 110, 210, the first terminal 117, the second terminal 118, the first bus bar 119, and the second bus bar 122 may be made of the same metal material, but the present disclosure is not limited thereto.

<Snubber Circuits 300, 310, 320, 330>

The switch assembly of the reactive power compensation apparatus according to an embodiment may include snubber circuits 300, 310, 320, 330.

The snubber circuit may include a first resistor module 300, a second resistor module 310, a first capacitor module 320, and a second capacitor module 330.

The first resistor module 300 may include a first resistor substrate 301 and a plurality of first resistor devices 303 mounted on the first resistor substrate 301. For instance, the plurality of first resistor devices 303 may be connected in series. The second resistor module 310 may include a second resistor substrate 311 and a plurality of second resistor devices 313 mounted on the second resistor substrate 311. For instance, the plurality of second resistor devices 313 may be connected in series.

The first capacitor module 320 may include a first capacitor substrate 321 and a plurality of first capacitor devices 323 mounted on the first capacitor substrate 321. For instance, the plurality of first capacitor devices 323 may be connected in parallel. The second capacitor module 330 may include a second capacitor substrate 331 and a plurality of second capacitor devices 333 mounted on the second capacitor substrate 331. For instance, the plurality of second capacitor devices 333 may be connected in parallel.

In terms of electric circuit, the first resistor device 303 and the second resistor device 313 are connected in series, and the first and second capacitor devices 303, 313 are connected between the first resistor device 303 and the second resistor device 313. The first and second capacitor devices 321, 333 may are connected in parallel.

In terms of arrangement structure, the first resistor substrate 301 of the first resistor module 300 may be fastened to the first supporting member 125 at one side and fastened to the second supporting member 128 at the other side. The second resistor substrate 311 of the second resistor module 310 may be fastened to the first supporting member 225 at one side and fastened to the second supporting member 228 at the other side. The first capacitor substrate 321 of the first capacitor module 320 may be fastened to the first supporting member 125 at one side and fastened to the second supporting member 128 at the other side. The second capacitor substrate 331 of the second capacitor module 330 may be fastened to the first supporting member 225 at one side and fastened to the second supporting member 228 at the other side. Moreover, the first resistor module 300 may be disposed on one side of the first switching module 100, and the second resistor module 310 may be disposed on one side of the second switching module 200. The first and second capacitor modules 320 may be disposed on the other side of the first switching module 100, and the second capacitor module 330 may be disposed on the other side of the second switching module 200.

In terms of cooling, first branch pipes 381, 383 branched from the first main pipe 380 are connected to the cooling plate 104 of the first switching module 100 and the cooling plate 204 of the second switching module 200. The first connection pipe 411 may be connected between the cooling plate 104 of the first switching module 100 and the resistor device 303 of the first resistor module 300. The second connection pipe 413 may be connected between the cooling plate 204 of the second switching module 200 and the resistor device 313 of the second resistor module 310. The second branch pipes 391, 393 may be connected from the second main pipe 390 to the resistor device 303 of the first resistor module 300 and the resistor device 313 of the second resistor module 310. Accordingly, cooling water is supplied to the cooling plate 104 of the first switching module 100 and the cooling plate 204 of the second switching module 200 through the first main pipe 380 and the first branch pipes 381, 383 to cool the switch 101 of the first switching module 100 and the switch 201 of the second switching module 200, and then discharged through the first and second connection pipes 411, 413, the second branch pipes 391, 393 and the second main pipe 390.

<First and Second Support Plates 360, 370>

The switch assembly of the reactive power compensation apparatus according to an embodiment may include first and second support plates 360, 370 disposed above and below the first and second switching modules 100, 200.

The first and second switching modules 100, 200 may be disposed between the first support plate 360 and the second support plate 370. The first and second switching modules 100, 200 may be supported by the first support plate 360 and the second support plate 370. For instance, an upper side of the first and second switching modules 100, 200 is fastened to the first support plate 360 and a lower side of the first and second switching modules 100, 200 is fastened to the second support plate 370. The second support plate 370 may be fastened to an upper side of the support module 400.

<First and Second Corona Shields 340, 350>

The switch assembly of the reactive power compensation apparatus according to an embodiment may include first and second corona shields 340, 350.

The first and second corona shields 340, 350 may have a ring shape larger than a size of each of the first and second support plates 360, 370. Each of the first and second corona shields 340, 350 may be disposed to surround the first and second support plates 360, 370, and fastened to at least one or more regions of the first and second support plates 360, 370. Since the first and second corona shields 340, 350 are larger than the size of each of the first and second support plates 360, 370, the first and second corona shields 340, 350 may be disposed to be spaced apart in an outward direction from each of the first and second support plates 360, 370. Accordingly, as intermediate connecting members, a plurality of fastening connecting portion may be provided to fasten the first and second corona shields 340, 350 to the first and second support plates 360, 370.

<First and Second Main Pipes 380, 390, First and Second Branch Pipes 381, 383, 391, 393, and First and Second Connecting Pipes 411, 413>

The reactive power compensating apparatus according to an embodiment may include first and second main pipes 380, 390, first and second branch pipes 381, 383, 391, 393, and first and second connecting pipes 411, 413.

The first main pipe 380 may be disposed on one side surface of one of the first and second switching modules 100, 200. The second main pipe 390 may be disposed on the other side surface of one of the first and second switching modules 100, 200.

The first branch pipes 381, 383 may be branched from the first main pipe 380 in both directions and connected to the cooling plates 104, 204 of the first and second switching modules 100, 200, respectively. The second branch pipes 391, 393 may be branched from the second main pipe 390 in both directions and connected to the resistor devices 303, 313 of the first and second resistor modules 300, 310, respectively.

The first connection pipe 411 may be connected between the cooling plate 104 of the first switching module 100 and the resistor device 303 of the first resistor module 300. The second connection pipe 413 may be connected between the cooling plate 204 of the second switching module 200 and the resistor device 313 of the second resistor module 310.

Accordingly, cooling water is supplied to the cooling plate 104 of the first switching module 100 and the cooling plate 204 of the second switching module 200 through the first main pipe 380 and the first branch pipes 381, 383 to cool the switch 101 of the first switching module 100 and the switch 201 of the second switching module 200, and then discharged through the first and second connection pipes 411, 413, the second branch pipes 391, 393 and the second main pipe 390.

For instance, the first and second main pipes 380, 390, the first and second branch pipes 381, 383, 391, 393 and the first and second connection pipes 411, 413 may be made of different materials. For instance, the first and second main pipes 380, 390, the first and second branch pipes 381, 383, 391, 393 may be made of a resin material, and the first and second connection pipes 411, 413 may be made of a copper (Cu) material.

The first and second connection pipes 411, 413 are disposed adjacent to the switches 101, 201 of the first and second switching modules 100, 200. A considerable amount of heat is generated in the switches 101, 201 of the first and second switching modules 100, 200, and thus the first and second connection pipes 411, 413 must be formed of a material having excellent heat resistance. Therefore, the first and second connection pipes 411, 413 are made of copper, and thus not affected by heat generated by the switches 101, 201 of the first and second switching modules 100, 200.

The first and second main pipes 380, 390 and the first and second branch pipes 381, 383, 391, 393 are disposed on an outer surfaces of the first and second switching modules 100, 200, and thus hardly affected by heat generated by the switching of the first and second switching modules 100, 200. Therefore, a resin material which is cheaper than copper may be used for the first and second main pipes 380, 390 and the first and second branch pipes 381, 383, 391, 393.

In the above description, the first switching module 100 may be referred to as a second switching module, and the second switching module 200 may be referred to as a first switching module. The first electrode plate 107, 207 may be referred to as a second electrode plate and the second electrode plate 110, 210 may be referred to as a first electrode plate. The first terminal 113, 213 may be referred to as a second terminal, and referred to as a second terminal 116, 216. The first connecting electrode 117 may be referred to as a second connecting electrode, and the second connecting electrode 118 may be referred to as a first connecting electrode. The first bus bar 119 may be referred to as a second booth bar, and the second bus bar 122 may be referred to as a first booth bar. The first supporting member 125, 225, 360 may be referred to as a second supporting member, and the second supporting member 128, 228, 370 may be referred to as a first supporting member. The first pressing member 131, 231 may be referred to as a second pressing member, and the second pressing member 134, 234 may be referred to as a first pressing member. The first resistor module 300 may be referred to as a second resistor module, and the second resistor module 313 may be referred to as a first resistor module. The first main pipe 380 may be referred to as a second main pipe, and the second main pipe 390 may be referred to as a first main pipe. The first connection pipe 411 may be referred to as a second connection pipe, and the second connection pipe 413 may be referred to as a first connection pipe.

The detailed description thereof should not be construed as restrictive in all aspects but considered as illustrative. The scope of the embodiment should be determined by reasonable interpretation of the appended claims and all changes that come within the equivalent scope of the embodiment are included in the scope of the embodiment.

What is the claimed is:

1. A switch assembly of a reactive power compensation apparatus, the switch assembly comprising:
   a support module;
   a first switching module having a first stack structure perpendicular to the support module; and
   a second switching module having a second stack structure perpendicular to the support module, the second switching module being connected in parallel with the first switching module,
   wherein each of the first and second switching modules comprises:
   first through (n+1)th cooling plates stacked along a vertical direction with respect to the support module;
   first through nth switches respectively disposed between the first through (n+1)th cooling plates;
   a first electrode plate disposed on the (n+1)th cooling plate;
   a first supporting member disposed on the first electrode plate;
   a first pressing member disposed between the first electrode plate and the first supporting member;
   a second electrode plate disposed below the first cooling plate;
   a second supporting member disposed below the second electrode plate; and
   a second pressing member disposed between the second electrode plate and the second supporting member, and
   the second pressing member comprises:
   a first pressing support portion disposed between the second electrode plate and the second supporting member; and
   an insertion guide portion configured to guide the insertion of a pressing device that presses the first pressing support portion.

2. The switch assembly of claim 1, further comprising:
   a second pressing support portion disposed between the first pressing support portion and the insertion guide portion.

3. The switch assembly of claim 2, wherein the insertion guide portion comprises:
   a horizontal portion disposed on the second supporting member; and
   a vertical portion extended from the horizontal portion through the second supporting member.

4. The switch assembly of claim 3, wherein the horizontal portion and the second pressing support portion are in surface contact with each other.

5. The switch assembly of claim 3, wherein the vertical portion comprises an insertion hole for inserting the pressing device.

6. The switch assembly of claim 2, wherein the first pressing support portion comprises an insertion groove corresponding to a protruding portion of the pressing device.

7. The switch assembly of claim 2, wherein the second pressing support portion comprises an opening one side of which is open.

8. The switch assembly of claim 7, wherein the second pressing support portion comprises a plurality of support plates.

9. The switch assembly of claim 1, wherein the first pressing member comprises:
   a pressing portion disposed between the first supporting member and the first electrode plate; and
   an elastic portion disposed between the first supporting member and the pressing portion.

10. The switch assembly of claim 9, wherein the pressing portion comprises a first region in surface contact with the (n+1)th cooling plate, a second region smaller than an area of the first region and extended in an upward direction from the first region, and a third region extended above the first supporting member from the second region through the first supporting member.

11. The switch assembly of claim 10, wherein the elastic portion surrounds the second region of the pressing portion.

12. The switch assembly of claim 9, wherein the elastic portion surrounds the first region located below the first supporting member.

* * * * *